United States Patent
Sjöberg et al.

(10) Patent No.: US 12,392,711 B2
(45) Date of Patent: Aug. 19, 2025

(54) ABSORTION SHEET FOR ABSORBING POWER FROM AN ELECTROMAGNETIC WAVE, SYSTEM FOR PERFORMING A RADIATION CHARACTERIZATION, METHOD FOR MEASURING AN ELECTROMAGNETIC RADIATIVE NEAR FIELD USING THE SAME

(71) Applicant: MXWaves AB, Lund (SE)

(72) Inventors: Daniel Sjöberg, Malmö (SE); Mats Gustafsson, Malmö (SE); Johan Lundgren, Lund (SE)

(73) Assignee: MXWaves AB, Lund (SE)

( * ) Notice: Subject to any disclaimer, the term of this patent is extended or adjusted under 35 U.S.C. 154(b) by 170 days.

(21) Appl. No.: 18/247,918

(22) PCT Filed: Oct. 7, 2021

(86) PCT No.: PCT/EP2021/077704
§ 371 (c)(1),
(2) Date: Apr. 5, 2023

(87) PCT Pub. No.: WO2022/074125
PCT Pub. Date: Apr. 14, 2022

(65) Prior Publication Data
US 2024/0011893 A1    Jan. 11, 2024

(30) Foreign Application Priority Data
Oct. 9, 2020   (SE) .................................... 2051181-2

(51) Int. Cl.
*G01N 21/17*   (2006.01)
*G01R 29/08*   (2006.01)
*H01Q 17/00*   (2006.01)

(52) U.S. Cl.
CPC ....... *G01N 21/171* (2013.01); *G01R 29/0885* (2013.01); *H01Q 17/007* (2013.01); *G01N 2021/1714* (2013.01)

(58) Field of Classification Search
CPC ......... G01N 21/171; G01N 2021/1714; G01R 29/0885; G01R 29/0871; H01Q 17/007;
(Continued)

(56) References Cited

U.S. PATENT DOCUMENTS

2013/0314765 A1* 11/2013 Padilla .............. G02F 1/133377
428/209
2017/0219746 A1* 8/2017 Nagao ...................... C23F 1/02
(Continued)

FOREIGN PATENT DOCUMENTS

CN          111517831 A       8/2020
EP          3187908 A1        7/2017
(Continued)

OTHER PUBLICATIONS

Alon, Leeor, Prospects for Millimeter-Wave Compliance Measurement Technolgies, IEEE Antennas & Propa gation Magazine, Apr. 2017, 11 pages.
(Continued)

*Primary Examiner* — Akm Zakaria
(74) *Attorney, Agent, or Firm* — DINSMORE & SHOHL LLP

(57) ABSTRACT

An absorption sheet for absorbing power from an electromagnetic wave generated by a device under test includes a substrate and an array of absorption elements. Each absorption element includes a conductive portion and a resistive portion. A system for performing a radiation characterization includes the absorption sheet. A method of measuring a
(Continued)

radiative near field of a device under test and a method of characterizing a radiative near field of a device under test are also disclosed.

17 Claims, 10 Drawing Sheets

(58) Field of Classification Search
CPC .............. H01Q 17/008; B32B 2250/02; B32B 2307/202; B32B 2307/206; B32B 2307/304; B32B 2457/00; B32B 3/08; B32B 3/10; B32B 15/082; B32B 27/281; B32B 27/30; B32B 27/322; B32B 7/025; H05K 9/00
See application file for complete search history.

(56) References Cited

U.S. PATENT DOCUMENTS

| | | |
|---|---|---|
| 2019/0080978 A1 | 3/2019 | Kumura |
| 2019/0178720 A1* | 6/2019 | Padilla ............... G01N 21/3581 |
| 2020/0045859 A1 | 2/2020 | Kagawa |
| 2020/0413578 A1* | 12/2020 | Toyoda ..................... B32B 7/12 |
| 2022/0037788 A1* | 2/2022 | Pajona ................... H01Q 7/005 |

FOREIGN PATENT DOCUMENTS

| | | |
|---|---|---|
| JP | 2020061506 A | 4/2020 |
| WO | 2020202939 A1 | 10/2020 |

OTHER PUBLICATIONS

Brown, Kenneth, Far-Field Antenna Pattern Measurement Using Near-Field Thermal Imaging, IEEE Transactions On Antennas and Propagation, vol. 66, No. 3, Mar. 2018, 9 pages.

Shahramian, Shahriar, A Fully Integrated 384-Element, 16-Tile, W-Band Phased Array With Self-Alignment and Self-Test, IEEE Journal of Solid-State Circuits, vol. 54, No. 9, Sep. 2019, 16 pages.

* cited by examiner

ABSORPTION SHEET FOR ABSORBING POWER FROM AN ELECTROMAGNETIC WAVE, SYSTEM FOR PERFORMING A RADIATION CHARACTERIZATION, METHOD FOR MEASURING AN ELECTROMAGNETIC RADIATIVE NEAR FIELD USING THE SAME

CROSS-REFERENCE TO RELATED APPLICATIONS

This application is the U.S. National Stage of PCT/EP2021/077704 filed on Oct. 7, 2021, which claims priority to Sweden Patent Application 2051181-2 filed on Oct. 9, 2020, the entire content of both are incorporated herein by reference in their entirety.

The present disclosure relates to an absorption sheet for absorbing power from an electromagnetic wave, a system and method for performing a radiation characterization, and a method of measuring a radiative near field of a device under test. The devices and methods may, in particular, be employed on millimeter waves, i.e. electromagnetic waves within the frequency range of 30-300 GHz. The devices and methods may, specifically, be applied to 5G devices and equipment.

BACKGROUND OF THE INVENTION

Electromagnetic radiation in the frequency range 30-300 GHz is often referred to as mmWaves due to the wavelength in free space, being in the order of millimeters. Several bands exist within this range, which have not been heavily used in the past decades. However, these frequencies are becoming increasingly important in several application areas. A contributor to this interest is the evolution of wireless access systems.

The next generation of wireless technology system, commonly known under the umbrella name 5G, incorporates frequency ranges in, and around, the mmWaves.

When humans interact, and otherwise stay close to the devices, the radiating field of the devices deposit energy onto the skin and into tissue. This energy results in a change of temperature. The change of temperature is often small and not noticeable or impactful, provided that the fields are low enough, i.e. comply with regulations. The electromagnetic field (EMF) compliance has to be assessed prior to market release for these devices to verify safe operation.

Several measurement techniques to obtain the incident power density exist. One well-established measurement technique uses phaseless measurements of the electric field. The method utilized a miniaturized diode-loaded probe and obtains the amplitude of the electric field from a scan of sub-wavelength distances from the device under test (DUT). The phase is then estimated from a comparison with a second measurement of another plane, involving a plane-to-plane reconstruction algorithm. Finally, the power density is reconstructed based on the estimated phase. The technique has several drawbacks, including uncertainty and expensive equipment.

Other conventional techniques which retrieve both amplitude and phase suffer from uncertainty in positioning due to non-ideal probes and inherent probe calibration issues. Some techniques are complex, others are not accurate and yet others involve scanning and are thus relatively time demanding.

There is thus a need for a technique for measuring or characterizing the electromagnetic radiation from a device with improvements in relation to accuracy and/or speed and/or cost.

SUMMARY OF THE INVENTION

The present disclosure relates to, in a first embodiment, an absorption sheet for absorbing power from an electromagnetic wave generated by a device under test, the absorption sheet comprising:
  a substrate having low thermal conductivity and low electrical conductivity;
  an array of absorption elements configured to absorb electromagnetic energy from the electromagnetic wave, the array of absorption elements embedded in or arranged on the substrate, each absorption element comprising:
    a. a conductive portion made of an electrically conductive material, such as a metal, wherein the conductive portion is adapted to receive the electromagnetic wave;
    b. a resistive portion embedded in the conductive portion, the resistive portion adapted to absorb heat from a current generated by the electromagnetic wave in the conductive portion.

The disclosure further relates to a method of measuring a radiative near field of a device under test, the method comprising the steps of:
  providing an absorption sheet comprising an array of isolated absorption elements configured to absorb electromagnetic energy from an electromagnetic wave from the device under test and generate heat locally in the absorption elements;
  arranging the absorption sheet in proximity to the device under test;
  enabling the device under test to generate the electromagnetic wave;
  obtaining thermal images of the absorption sheet;
  converting the thermal images to a distribution of magnitudes of the electromagnetic wave of the absorption sheet.

By using an absorption sheet comprising an array of isolated absorption elements configured to absorb electromagnetic energy from an electromagnetic wave from the device under test and generate heat locally in the absorption elements, a heat distribution corresponding to the distribution of the radiation from the device under test can be obtained. A thermal camera can then be used to get a quick and accurate estimation of the radiation from the device under test.

The presently disclosed absorption sheet and method of measuring a radiative near field of a device under test can be used in compliance testing, for example, compliance testing of a 5G device.

In contrast to techniques using a homogeneous sheet, which may be more difficult to heat and typically has thermal conduction that will spread out the heat, the presently disclosed absorption sheet has an array of absorption elements configured to absorb electromagnetic energy from the electromagnetic wave and not spread the heat over the surface. The absorption elements may be arranged in a grid wise fashion. Since the substrate has low thermal conductivity and low electrical conductivity, the absorption elements are isolated from each other. As the electromagnetic wave generated by a device under test distributes over the absorption sheet, heat is observed in local regions defined by the absorption elements. The conversion from electromagnetic energy to thermal energy may thus occur in local regions of the sheet. Preferably, the absorption elements are designed to be resonant to the frequency of interest. In practice, for an electromagnetic wave having a frequency in the range of 30-300 GHz, the length of the absorption elements may be in the order of millimeters.

Moreover, in contrast to traditional antennas, for the purpose of measuring the radiative near field of the device under test, the absorption elements preferably comprise a resistive portion. Heat may thus be generated in the resistive portion through ohmic loss in a portion of the total absorption element. In the view of the thermal camera, the resistive portion may be regarded as measurement points. By receiving images covering a number of measurement points, measurements for the whole sheet can be made at the same time.

As further described in the detailed description, the inventors have realized that a number of parameters may have an impact on the performance of the presently disclosed absorption sheet and method of measuring a radiative near field of a device under test. For example, it is an advantage to design the absorption elements to be resonant to the frequency of the electromagnetic wave. Preferably, the substrate is made of a material having low thermal conductivity and low electrical conductivity. The material selected for the substrate may also have a relatively low heat capacity. As an example, polytetrafluoroethylene (Teflon), may be used. The conductive portions may be made of an electrically conductive material, such as a metal, for example gold, silver or copper. The resistive portion may be made of material that is a suitable tradeoff between an electrically conductive material and a resistive material, such as NiCr 80/20.

The present disclosure further relates to a system for performing a radiation characterization, such as a millimeter wave characterization, of a device under test. The system may comprise any embodiment of the presently disclosed absorption sheet and:
  a thermal imaging camera, such as an infra-red camera; and
  a processing unit configured to convert images from the thermal imaging camera providing a heat distribution to a corresponding radiation distribution of the electromagnetic wave.

The present disclosure further relates to a method of characterizing a radiative near field of a device under test, the method comprising the steps of:
  providing an absorption sheet comprising an array of isolated absorption elements configured to absorb electromagnetic energy from an electromagnetic wave from the device under test and generate heat locally in the absorption elements;
  arranging the absorption sheet in proximity to the device under test;
  enabling the device under test to generate the electromagnetic wave;
  obtaining thermal images of the absorption sheet;
  characterizing the radiative near field of the device under test in an area based on the thermal images.

DETAILED DESCRIPTION OF THE PREFERRED EMBODIMENT

Figure 1:
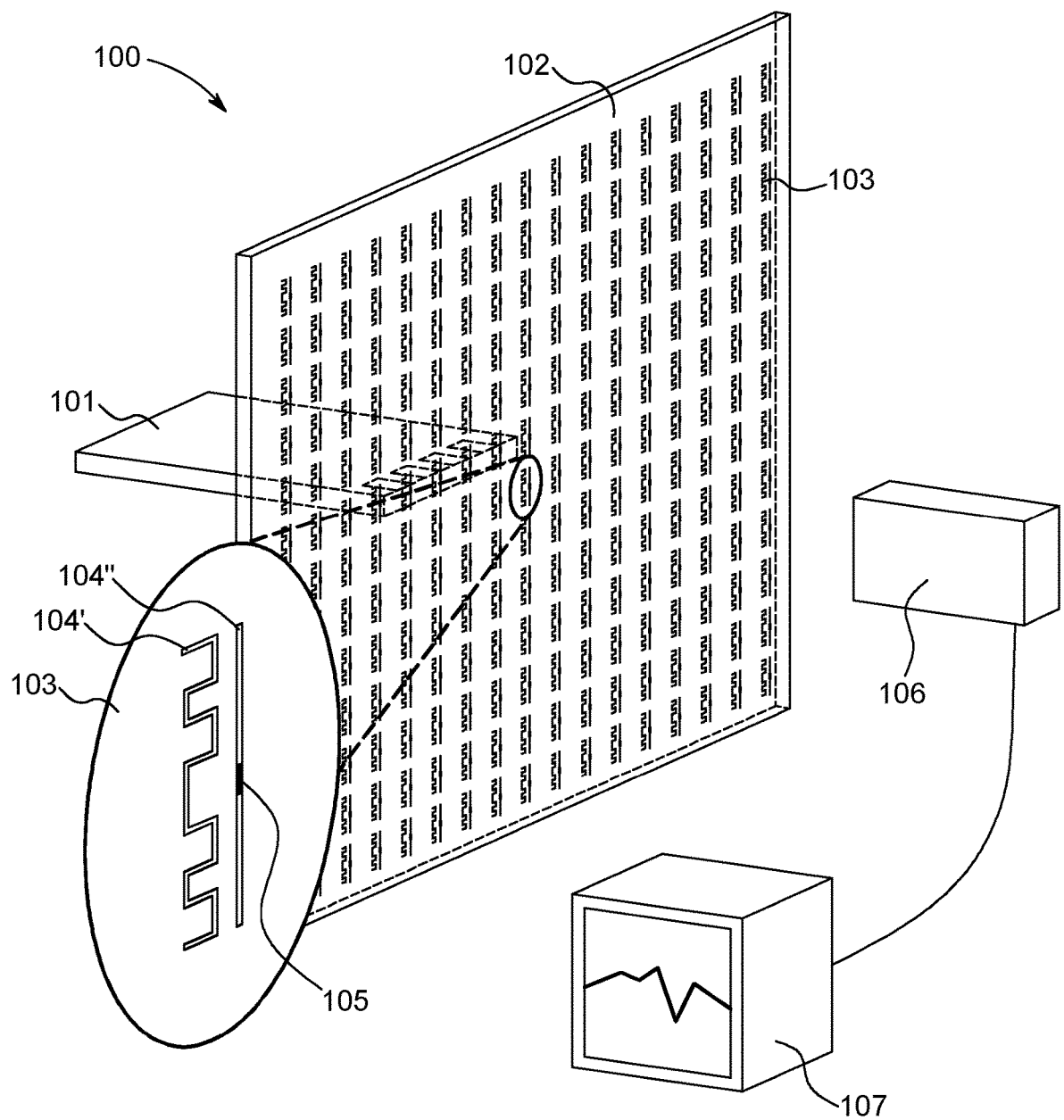
FIG. 1 shows one embodiment of the presently disclosed absorption sheet in a system further comprising a thermal camera and a processing unit.

The present disclosure relates to, in a first embodiment, an absorption sheet for absorbing power from an electromagnetic wave generated by a device under test, the absorption sheet comprising: a substrate having low thermal conductivity and low electrical conductivity; and an array of absorption elements configured to absorb electromagnetic energy from the electromagnetic wave, the array of absorption elements embedded in or arranged on the substrate. An array, according to the present disclosure, shall be broadly construed as absorption element(s) arranged in, for example an N×M configuration. In one embodiment, N=M=1. In this embodiment, a single absorption can be moved to create a virtual array of absorption elements. Moreover, if the N×M comprises a plurality of absorption elements, such as a group of absorption elements, the plurality of absorption elements can be moved over a larger area to create a virtual array of absorption elements. It can be a fully regular pattern with equal distances between the absorption elements, but the array may also be made in other implementations. The objective of having an array of absorption elements is to distribute the absorption element over a surface where each absorption element is configured to absorb power from the electromagnetic wave in a limited area. Preferably, the absorption elements are spaced apart from each other and electrically isolated from each other. In one embodiment the array comprises multiple elements. The array may comprise N×1 elements, 1×M elements, or N×M elements, wherein N>=2 and M>=2. In one embodiment, each absorption element comprises a conductive portion made of an electrically conductive material, such as a metal, wherein the conductive portion is adapted to receive the electromagnetic wave; and a resistive portion embedded in the conductive portion, the resistive portion adapted to absorb heat from a current generated by the electromagnetic wave in the conductive portion. Alternatively, the absorption element may comprise only one material, which, preferably is both electrically conductive and capable of absorbing heat.

'Sheet' shall be broadly construed as any surface of suitable dimension and shape that can be used for the purpose of absorbing power from an electromagnetic wave as described in the present disclosure. This means that the absorption sheet may be a very thin sheet, as will be demonstrated in examples, but it could also be less thin in certain applications. In one embodiment, the absorption sheet is thinner than 10 mm, preferably thinner than 5 mm, more preferably thinner than 2 mm, even more preferably thinner than 1 mm.

The absorption sheet may take any suitable shape. In one embodiment the absorption sheet has a substantially planar structure. The substantially planar absorption sheet can then be placed at the plane of interest. In a further embodiment the absorption sheet may be a bulged and/or substantially cup-shaped and/or substantially semi-spherical and/or substantially semi-cylindrical. Such a shape, for example the cup-shape or semi-cylindrical shape can be used to place the absorption sheet over the device under test, which may be, for example a 5G mobile phone. The shape of the absorption sheet is not limited to these shapes but can be any suitable complex or non-complex shape, including conformal to the DUT. The absorption sheet may also have a shape that forms a closed inner volume, such as a spherical shape, wherein the device under test can be placed in the inner volume.

Substrate

The substrate preferably has low thermal conductivity and low electrical conductivity. It is appreciated that the terms 'low thermal conductivity' and 'low electrical conductivity', in the present context, would be understood by a person skilled in the art. The meaning of the term 'low electrical conductivity' shall be given taking into account the intention that the absorption elements shall be electrically isolated from each other. The substrate may have an electrical conductivity σ lower than $10^{-4}$ S/m, preferably lower than than $10^{-7}$ S/m, more preferably lower than $10^{-10}$ S/m, even more preferably lower than $10^{-20}$ S/m. Preferably, the substrate shall absorb as little heat as possible. Therefore it is an advantage to use a material that has low thermal conductivity. The thermal conductivity k may therefore be lower than 1 W/m/K, preferably lower than 0.1 W/m/K, more preferably lower than 0.05 W/m/K. Examples of materials that have both low thermal conductivity and low electrical conductivity are polytetrafluoroethylene (Teflon) and polymethacrylimide. In one embodiment the substrate is therefore made of a thermoplastic polymer, such as polytetrafluoroethylene, and/or a thermoplastic material, such as polymethacrylimide (Rohacell).

Moreover, it may be an advantage to select the material of the substrate to have a low specific heat capacity. The substrate may therefore have a specific heat capacity c lower than 1500 J/K/kg, preferably lower than 1000 J/K/kg, more preferably lower than 500 J/K/kg.

Absorption Elements

The absorption elements are adapted to absorb electromagnetic energy from the electromagnetic wave from the device under test and generate heat locally. The absorption elements may comprise only one material, which, preferably is both electrically conductive and capable of absorbing heat. More preferably, each absorption element has a conductive portion made of an electrically conductive material, such as a metal, wherein the conductive portion is adapted to receive the electromagnetic wave; and a resistive portion embedded in the conductive portion, the resistive portion adapted to absorb heat from a current generated by the electromagnetic wave in the conductive portion.

In order to absorb as much power as possible, the absorption elements may be resonant to the electromagnetic wave. This means that the absorption elements have a length of approximately half of a wavelength of the electromagnetic wave. Electromagnetic radiation in the frequency range 30-300 GHz are often called mmWaves due to their corresponding wavelength, in free space, being on the order of millimeters. Hence, in one embodiment, the absorption elements have a length of 0.5-5 mm. In certain applications, the absorption elements may be even smaller, such as in the range of having a length of 0.1-5 mm.

As would be recognized by a person skilled in the art, many metals are electrically conductive and would be good candidates for the conductive portion of the absorption elements. In one embodiment, the conductive portion of the absorption elements is made of a metal, such as gold, silver or copper. Preferably, the conductive portion of the absorption elements has a relatively high thermal conductivity, preferably a thermal conductivity k greater than 10 W/m/K, preferably greater than 100 W/m/K.

Moreover, it may be beneficial to design the absorption elements thin since it will require less energy to heat the absorption elements. The absorption elements may be thinner than 10 mm, preferably thinner than 5 mm, more preferably thinner than 2 mm, even more preferably thinner than 1 mm, most preferably thinner than 0.1 mm.

The role of the resistive portion of the absorption element is to generate heat. Therefore, the material of the resistive portion may be selected to have an electrical conductivity σ lower than the electrical conductivity of the conductive portion. One example of a suitable material for the resistive portion is NiCr 80/20. The absorption elements can be seen as miniature antennas. An antenna is a device that intercepts some of the power of a radio wave in order to produce an electric current. As the electric current is generated in the absorption element, the resistive element, which may be placed, for example at the middle of an elongate absorption element, can generate heat by taking an electrical loss of the current in the absorption element. The absorption element may therefore be configured to absorb energy from the electromagnetic wave in a sub-region of the absorption sheet. In one embodiment, each absorption element has a first element part and a second element part, wherein the first element part and the second element part are separated by the resistive portion The absorption element may an elongate body, such as in the form of an elongate strip or rod. The absorption element may have a substantially straight shape, but may also be substantially square wave shaped and/or saw tooth shaped.

Figure 2A:
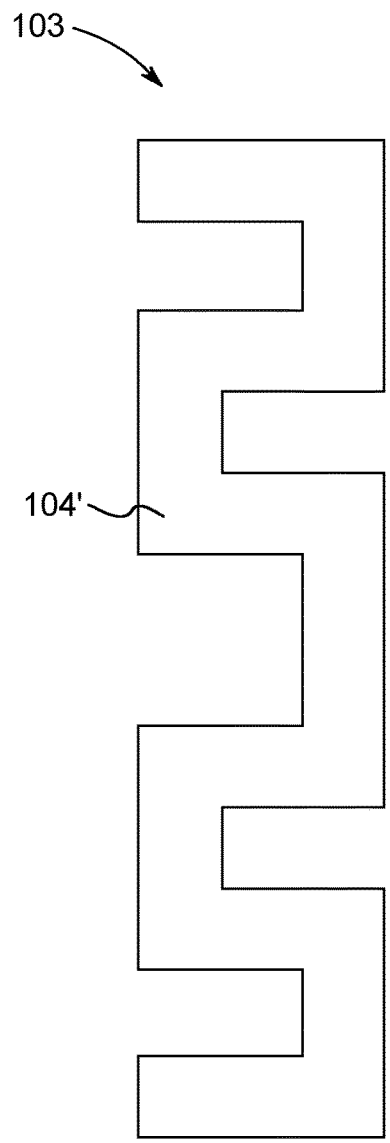
FIGS. 2A-B shows embodiments of the presently disclosed absorption elements.

In a further embodiment, as shown in the example of FIG. 2A, the absorption element comprises a first region and a second region, wherein the first and second regions are spaced apart from each other and capacitively coupled to each other. According to one embodiment, only one of the first region and the second region comprises a resistive portion.

System for Performing a Radiation Characterization

The present disclosure further relates to a system for performing a radiation characterization, such as a millimeter wave characterization, of a device under test, the system comprising:

an absorption sheet for absorbing power from an electromagnetic wave, wherein the absorption sheet is any embodiment of the presently disclosed absorption sheet;

a thermal imaging camera, such as an infra-red camera; and a processing unit configured to convert images from the thermal imaging camera providing a heat distribution to a corresponding radiation distribution of the electromagnetic wave.

Preferably, the absorption sheet comprises:

a substrate having low thermal conductivity and low electrical conductivity;

an array of absorption elements configured to absorb electromagnetic energy from the electromagnetic wave, the array of absorption elements embedded in or arranged on the substrate, each absorption element comprising: a conductive portion made of an electrically conductive material, such as a metal, wherein the conductive portion is adapted to receive the electromagnetic wave; and a resistive portion embedded in the conductive portion, the resistive portion adapted to absorb heat from a current generated by the electromagnetic wave in the conductive portion.

The device under test may be any user equipment or base station equipment that transmits electromagnetic waves. The user equipment includes, but is not limited to, mobile devices, such as mobile phones, smartphones, tablet computers, laptops, smart watches, head-mounted devices, cameras etc. In 5G networks there may be small local cells with mini base stations designed for very localized coverage. The presently disclosed system for performing a radiation characterization may be used for the characterization base station equipment, in particular base station equipment operating in mmWave frequency ranges.

The camera is configured to provide images of the absorption sheet at a specific point in time or during a limited interval. The processing unit may further be configured to control enabling and disabling of the radiation of the device under test. According to one example, the system may be configured to enable the device under test to radiate the electromagnetic wave. The radiation will then start accumulating heat in the absorption element, typically in the resistive portion. After either a predetermined time period, or by continuously observing the array of absorption elements, thermal images of the absorption sheet can be converted to a distribution of magnitudes of the electromagnetic wave of the absorption sheet. The system can thereby be set up to get a heat map that corresponds to the radiation of the device under test very quickly.

Method of Measuring and/or Characterizing a Radiative Near Field

The present disclosure further relates to a method of measuring a radiative near field of a device under test, the method comprising the steps of:
- providing an absorption sheet comprising an array of isolated absorption elements configured to absorb electromagnetic energy from an electromagnetic wave from the device under test and generate heat locally in the absorption elements;
- arranging the absorption sheet in proximity to the device under test;
- enabling the device under test to generate the electromagnetic wave;
- obtaining thermal images of the absorption sheet;
- converting the thermal images to a distribution of magnitudes of the electromagnetic wave of the absorption sheet, and to a method of characterizing a radiative near field of a device under test, the method comprising the steps of:
- providing an absorption sheet comprising an array of isolated absorption elements configured to absorb electromagnetic energy from an electromagnetic wave from the device under test and generate heat locally in the absorption elements;
- arranging the absorption sheet in proximity to the device under test;
- enabling the device under test to generate the electromagnetic wave;
- obtaining thermal images of the absorption sheet;
- characterizing the radiative near field of the device under test in an area based on the thermal images.

Preferably, the thermal images provide a heat distribution of the absorption sheet.

Any of the above methods may make use of the presently disclosed system, for example by enabling the device under test to generate the electromagnetic wave at a reference time, wherein the thermal images are obtained at least at a second point in time at a predefined delay relative to the reference time. The delay can be chosen such that thermal images are obtained approximately at a peak of heat in the absorption elements or over a period of time covering the peak of heat in the absorption elements.

The positioning of the absorption sheet relative to the device under test depends on the application and the operation of the device under test. The absorption sheet may be arranged at a distance within 0.1-200 mm from the device under test, preferably within 0.1-100 mm from the device under test, more preferably within 0.1-20 mm from the device under test, even more preferably within 0.1-5 mm from the device under test. The heat in each absorption element can be seen as a local heat that corresponds to the intensity of the electromagnetic wave a local area of each absorption element.

The method of measuring a radiative near field or method of characterizing a radiative near field may be part of a compliance test of the device under test. As an example, standards, such as a 3GPP standard, or any standard under the 5G wireless technology, may comprise radiation limits. In one embodiment of the presently disclosed method of measuring a radiative near field or method of characterizing a radiative near field, each absorption element may be seen as a measurement point. Each absorption element can thereby be considered a measurement of a conventional probe scanning setup. In the present configuration all measurement points can be obtained simultaneously. The method may comprise the step of comparing measured magnitudes of the electromagnetic wave in the measurement points against a predefined radiation threshold. The compliance test may then state, for example, that the magnitudes in all measurement points have to be less than a predefined limit.

Detailed Description of Drawings

The invention will in the following be described in greater detail with reference to the accompanying drawings. The drawings are exemplary and are intended to illustrate some of the features of the presently disclosed absorption sheet, system for performing a radiation characterization and methods of measuring a radiative near field of a device under test and characterizing a radiative near field of a device under test, and are not to be construed as limiting to the presently disclosed invention.

FIG. 1 shows one embodiment of the presently disclosed absorption sheet (100) in a system further comprising a thermal camera (106) and a processing unit (107). The processing unit (107) may be configured to convert images from the thermal imaging camera (106) providing a heat distribution to a corresponding radiation distribution of the electromagnetic wave. A device under test (101) generates an electromagnetic wave. The absorption sheet (100) is placed in proximity to the device under test (101) to absorb power from the electromagnetic wave generated by a device under test (101). The absorption sheet (100) comprises an array of absorption elements (103). In this example each absorption element (103) comprises a first region of a conductive portion (104') and second region of a conductive portion (104"), wherein the second region of a conductive portion (104") comprises a resistive portion (105).

Figure 2B:
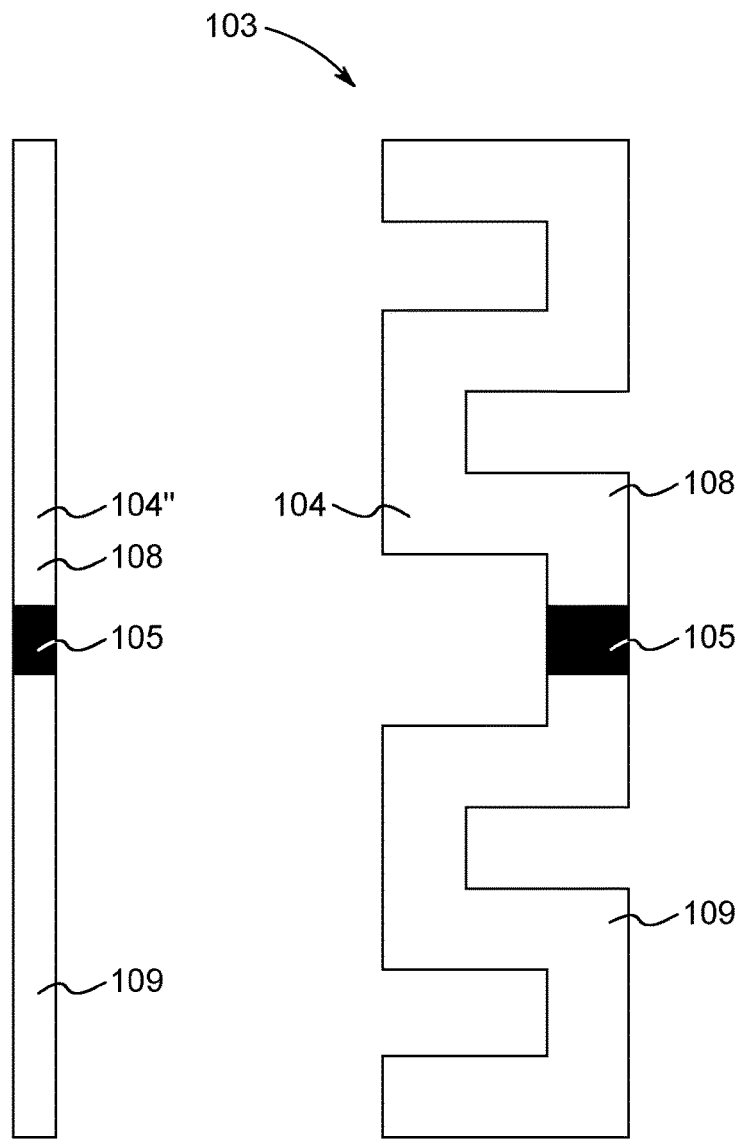

FIGS. 2A-B shows two embodiments of the presently disclosed absorption elements (103). FIG. 2A shows an embodiment having two separate regions of the conductive portion (104' and 104"). The second region comprises a resistive portion (105). The first region has a folded square wave shape. The second region has a first element part (108) and a second element part (109), wherein the first element part (108) and the second element part (109) are separated by the resistive portion (105). FIG. 2B shows a further embodiment in which the absorption element (103), which is square wave shaped, comprises a conductive portion (104) and a resistive portion (105). The conductive portion (104) has a first element part (108) and a second element part (109), wherein the first element part (108) and the second element part (109) are separated by the resistive portion (105).

Figure 3A:
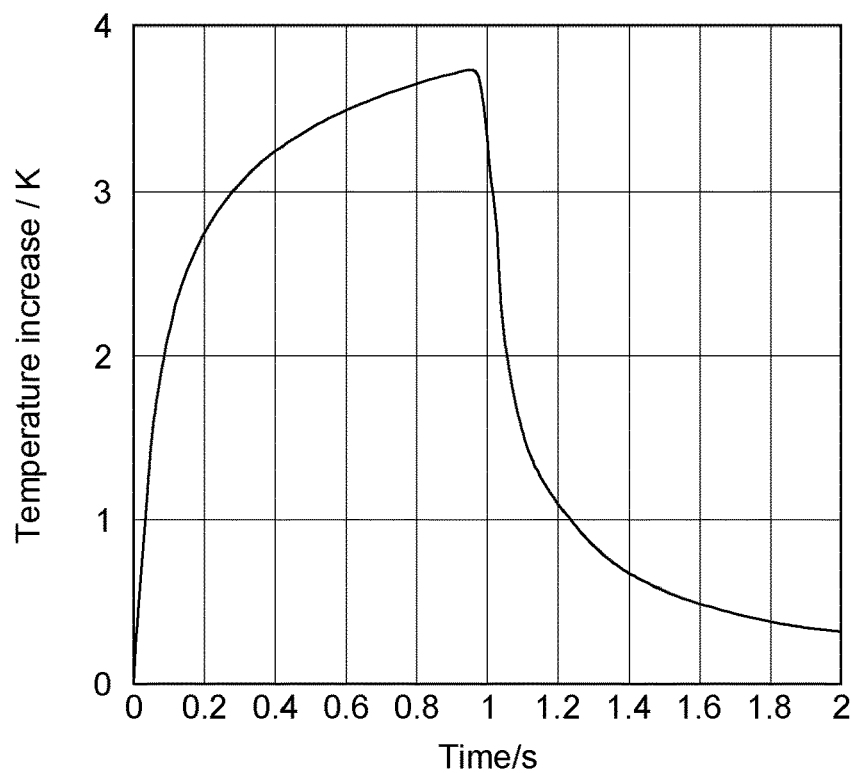
FIGS. 3A-B show the temperature increase in a resistive portion over time and the temperature distribution over an absorption element at a temperature peak.
Figure 3B:
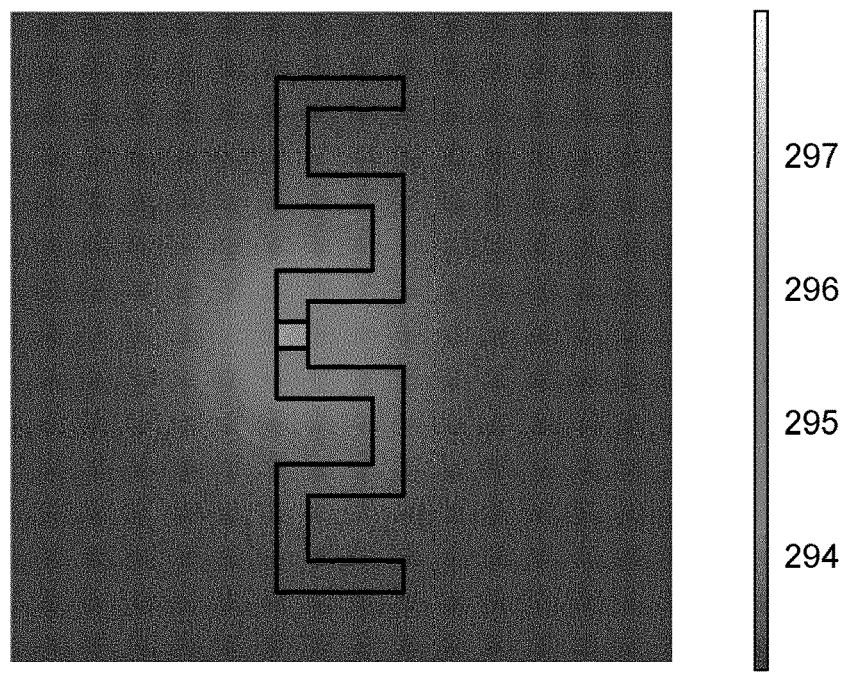

FIGS. 3A-B show the temperature increase in a resistive portion over time and the temperature distribution over an absorption element at a temperature peak. The average temperature increase in a restive portion for an impinging electromagnetic wave of frequency 28 GHz with a power density of 38 W/m² is shown in FIG. 3A. In the example the signal was turned on for 1 second and then turned off. In FIG. 3B it can be seen that the temperature is the highest in the region of the resistive portion.

Figure 4:
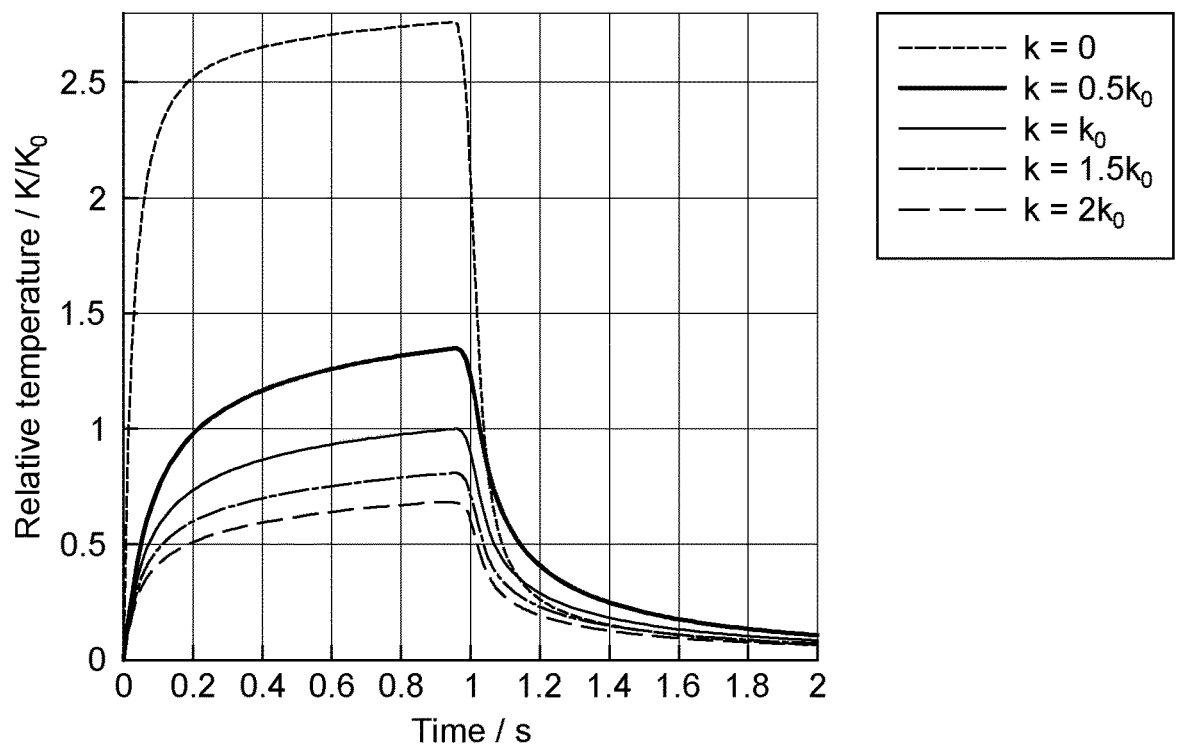
FIG. 4 shows the temperature increase in a portion element over time for different thermal conductivities in the substrate.

FIG. 4 shows the temperature increase in a resistive portion over time for different thermal conductivities in the substrate. The thermal conductivity in the substrate is normalized to polytetrafluoroethylene (Teflon).

Figure 5:
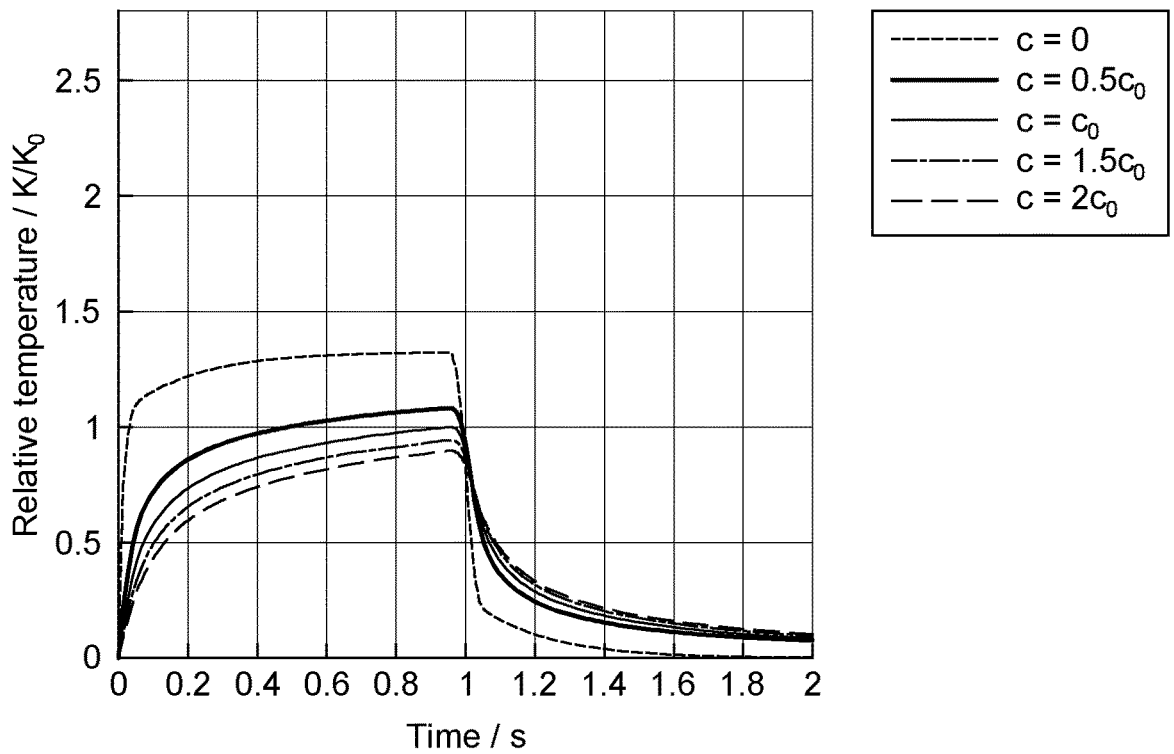
FIG. 5 shows the temperature increase in a resistive portion over time for different heat capacities in the substrate.
Figure 6A:
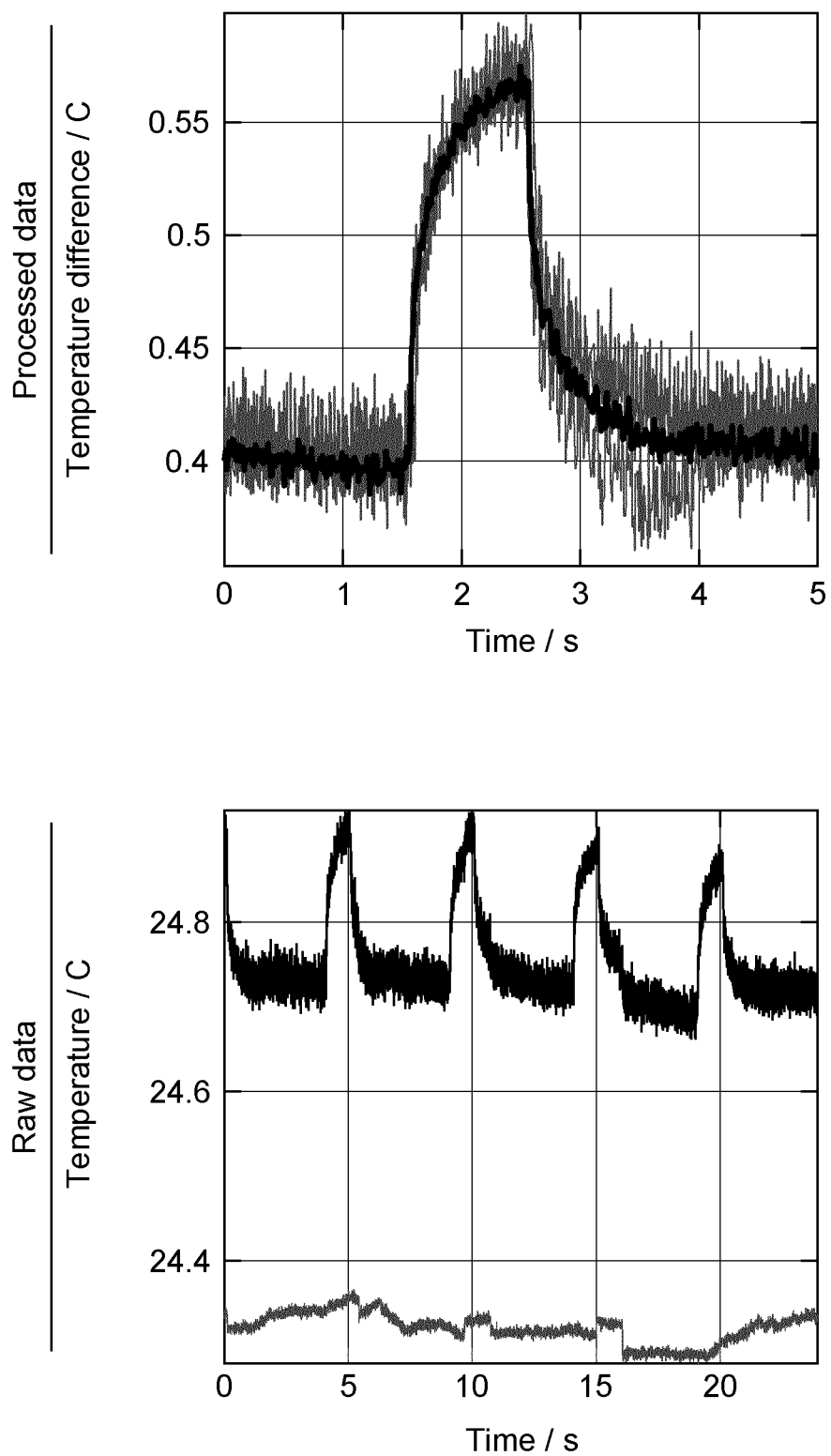
FIGS. 6A-D show measurements of temperatures over time for an absorption element for four different thermal cameras.
Figure 6B:
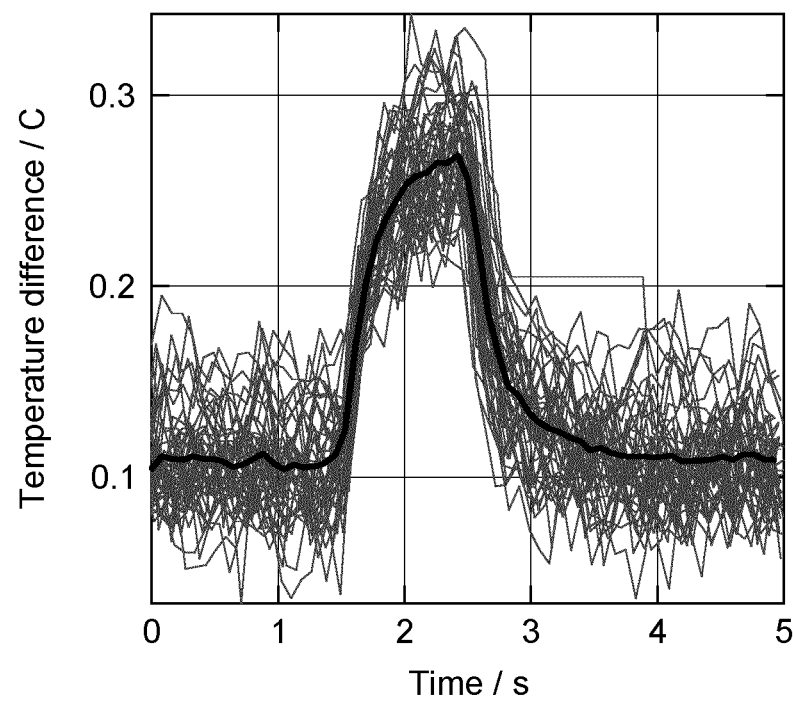
Figure 6B:
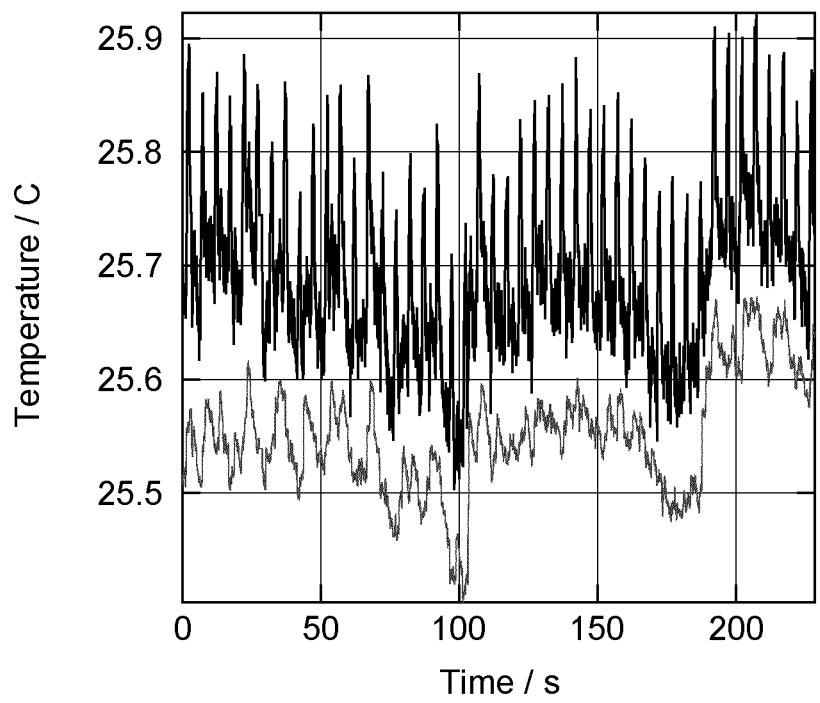
Figure 6C:
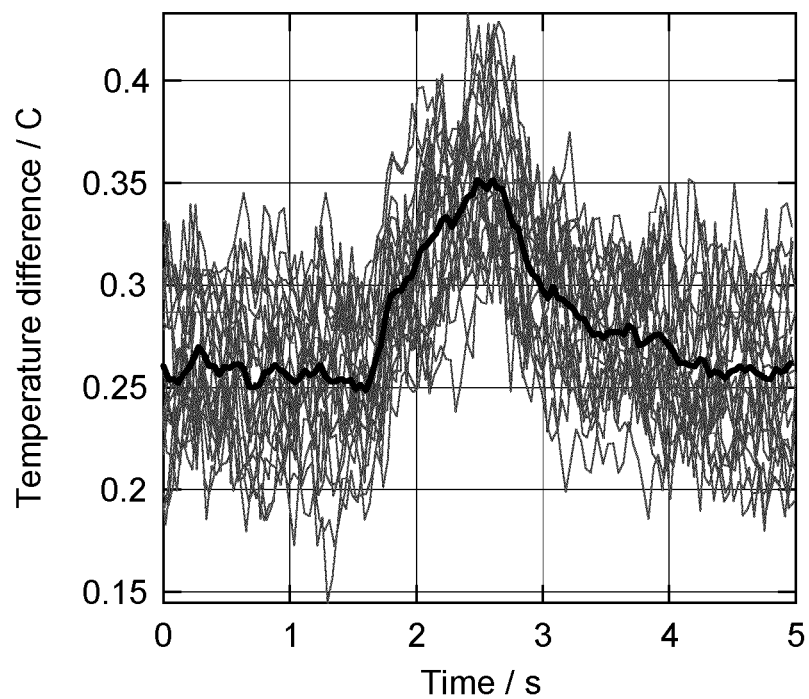
Figure 6C:
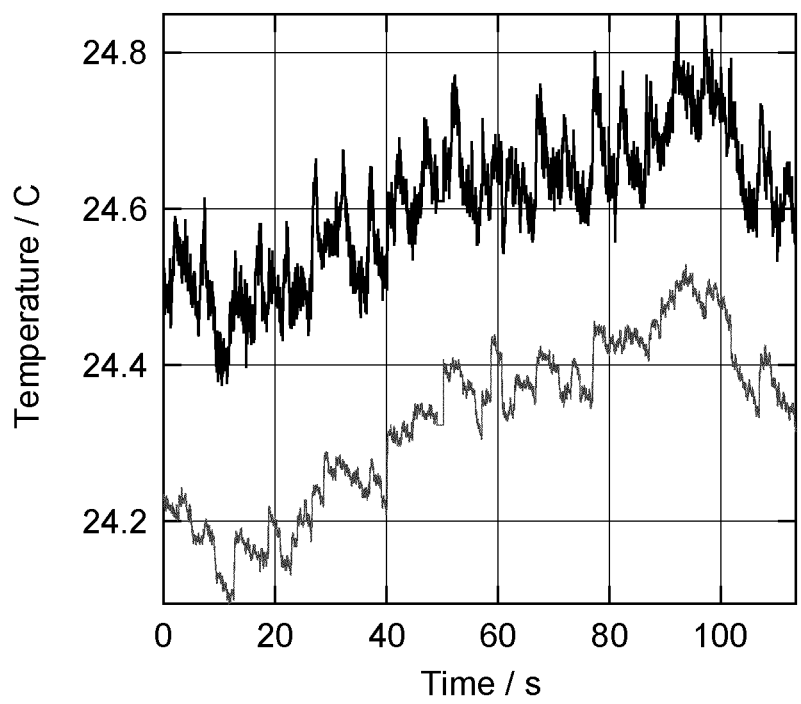
Figure 6D:
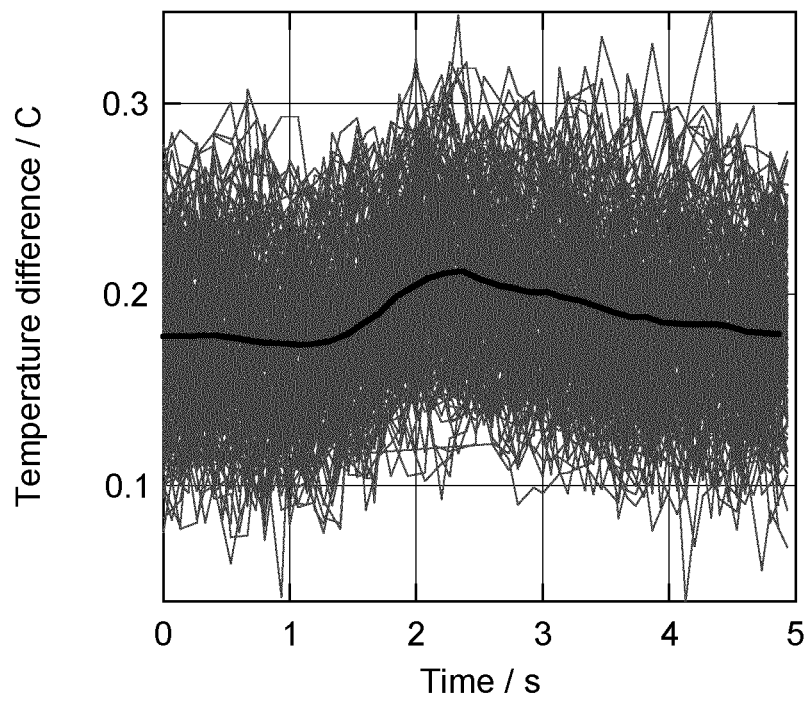
Figure 6D:
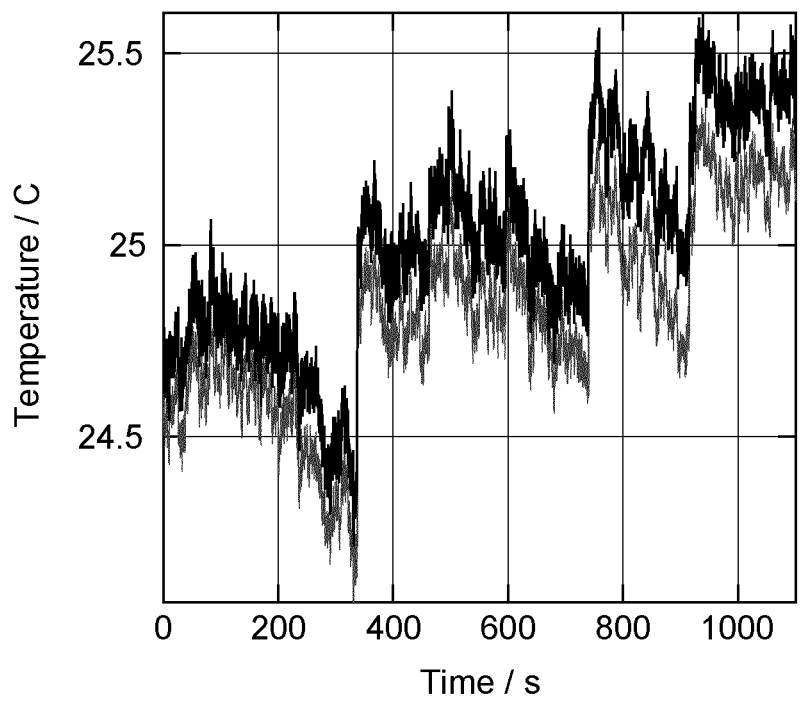

FIG. 5 shows the temperature increase in a resistive element over time for different heat capacities in the substrate. The heat capacity in the substrate is normalized to polytetrafluoroethylene (Teflon).

FIGS. 6A-D show measurements of temperatures over time for an absorption element for four different thermal cameras. Processed data is in the top row and raw data on the bottom. In the top row the black line shows the time-synchronous signal average, and the grey line represents the data gathered within one period. In the bottom row the darker and upper line represents the temperature of the absorption element, whereas the lower and brighter line represents the background data.

Figure 7:
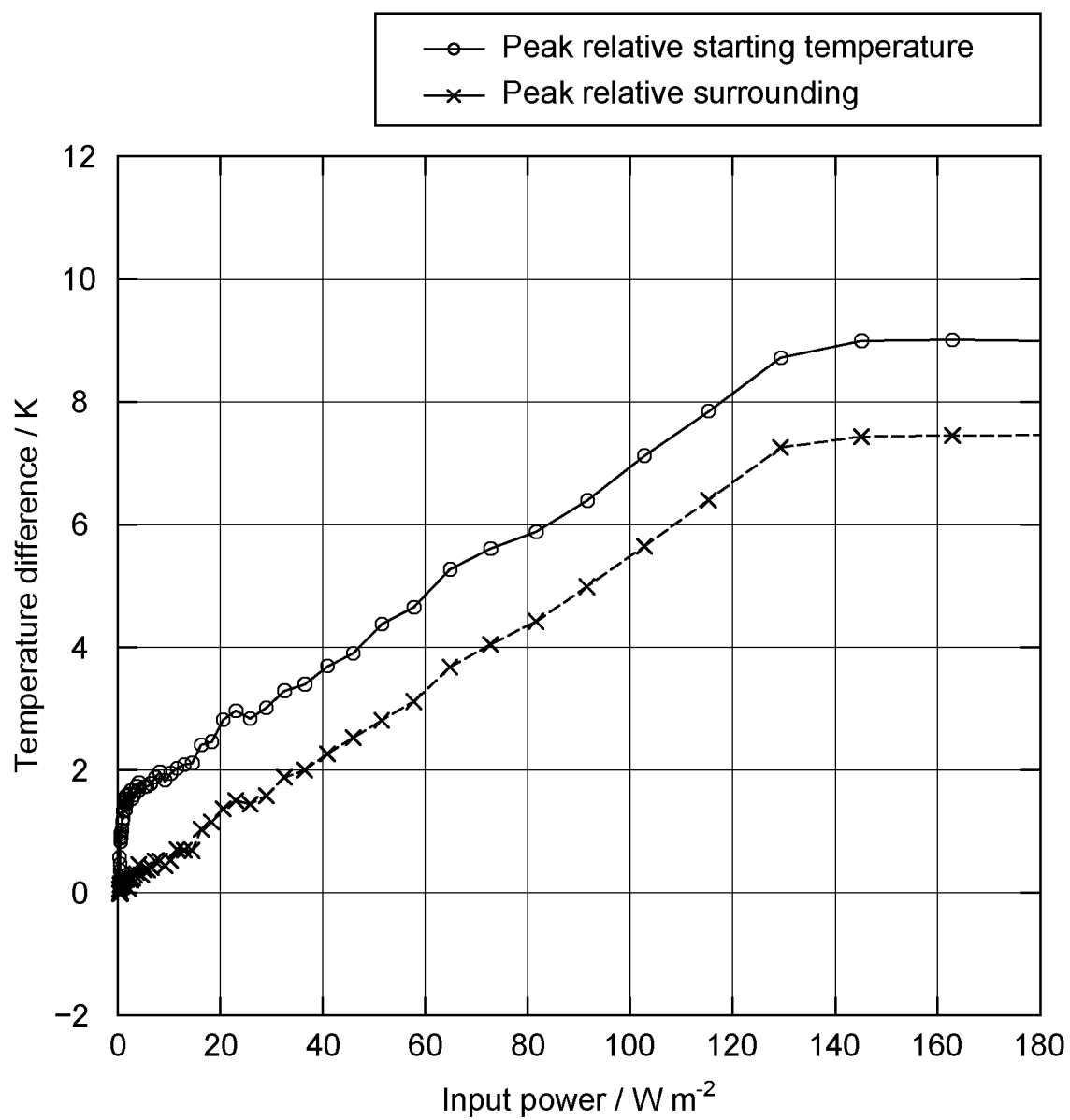
FIG. 7 shows the maximal temperature difference between the resistive portion and starting temperature of the resistive portion as well as the surrounding temperature.

FIG. 7 shows the maximal temperature difference between the resistive portion and starting temperature of the resistive portion as well as the surrounding temperature.

The curves show that even though the curves in FIG. 6 differ, a linear relationship between incident power density and temperature increase is observed.

Figure 8:
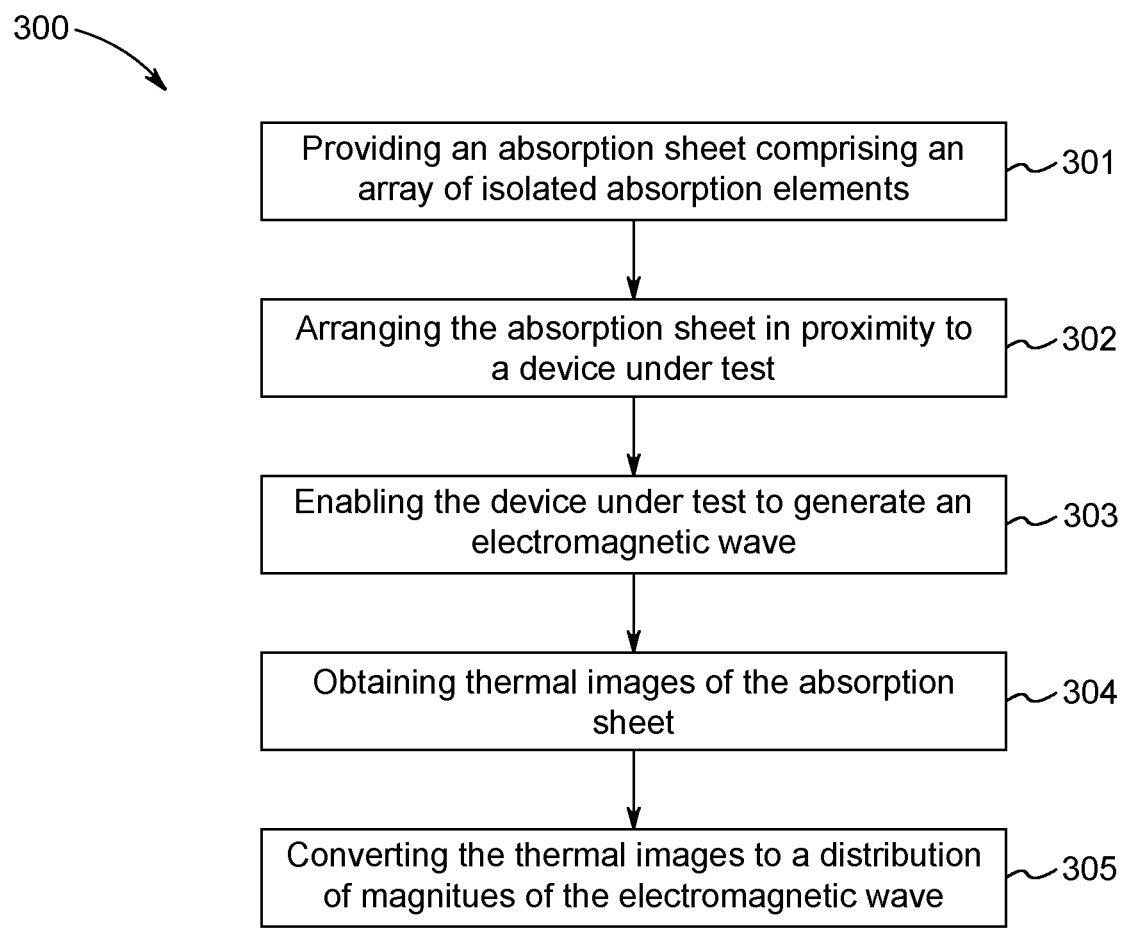
FIG. 8 shows an embodiment of the presently disclosed method of measuring a radiative near field of a device under test, alternatively method of characterizing a radiative near field of a device under test.

FIG. 8 shows an embodiment of the presently disclosed method of measuring a radiative near field of a device under test (300), alternatively method of characterizing a radiative near field of a device under test (300). The method comprises the steps of:
providing an absorption sheet comprising an array of isolated absorption elements configured to absorb electromagnetic energy from an electromagnetic wave from the device under test and generate heat locally in the absorption elements (301);
arranging the absorption sheet in proximity to the device under test (302);
enabling the device under test to generate the electromagnetic wave (303);
obtaining thermal images of the absorption sheet (304); and
converting the thermal images to a distribution of magnitudes of the electromagnetic wave of the absorption sheet (305).

EXAMPLE

The invention will in the following be described in a non-limiting example.

In one example an electromagnetic wave of frequency 28 GHz with a power density of 38 W/m² was tested on an absorption element of FIG. 2B. The temperature increase in the resistive portion over time and temperature distribution over the absorption element at the peak temperature can be seen in FIG. 3. In the example, the electromagnetic wave was enabled for 1 second and then disabled. The absorption element has a very thin, 10 nm, conductive portion in the form of a gold layer and NiCr 80/20 resistive portion deposited on a substrate in the form of a Teflon sheet of 0.05 mm thickness. As can be seen in FIG. 3B, the temperature is highest in the region of the resistive portion. Conduction in the substrate is also a factor to take into account. Candidates for substrates include polytetrafluoroethylene (Teflon) and polymethacrylimide (Rohacell).

Further Details of the Invention
1. An absorption sheet for absorbing power from an electromagnetic wave generated by a device under test, the absorption sheet comprising:
   a substrate having low thermal conductivity and low electrical conductivity;
   an array of absorption elements configured to absorb electromagnetic energy from the electromagnetic wave, the array of absorption elements embedded in or arranged on the substrate, each absorption element comprising:
   a conductive portion made of an electrically conductive material, such as a metal, wherein the conductive portion is adapted to receive the electromagnetic wave; and
   a resistive portion embedded in the conductive portion, the resistive portion adapted to absorb heat from a current generated by the electromagnetic wave in the conductive portion.
2. The absorption sheet according to item 1, wherein the absorption elements are spaced apart from each other.
3. The absorption sheet according to any one of the preceding items, wherein the absorption elements are electrically isolated from each other.
4. The absorption sheet according to any one of the preceding items, wherein the substrate has a thermal conductivity k lower than 1 W/m/K, preferably lower than 0.1 W/m/K, more preferably lower than 0.05 W/m/K.
5. The absorption sheet according to any one of the preceding items, wherein the substrate has an electrical conductivity $\sigma$ lower than $10^{-4}$ S/m, preferably lower than $10^{-7}$ S/m, more preferably lower than $10^{-10}$ S/m, even more preferably lower than $10^{-\circ}$ S/m.
6. The absorption sheet according to any one of the preceding items, wherein the substrate has a specific heat capacity c lower than 1500 J/K/kg, preferably lower than 1000 J/K/kg, more preferably lower than 500 J/K/kg.
7. The absorption sheet according to any one of the preceding items, wherein the substrate is made of a thermoplastic polymer, such as polytetrafluoroethylene, and/or a thermoplastic material, such as polymethacrylimide.

8. The absorption sheet according to any one of the preceding items, wherein the absorption sheet is thinner than 10 mm, preferably thinner than 5 mm, more preferably thinner than 2 mm, even more preferably thinner than 1 mm.
9. The absorption sheet according to any one of the preceding items, wherein the absorption sheet has a substantially planar structure.
10. The absorption sheet according to any one of items 1-8, wherein the absorption sheet is bulged and/or substantially cup-shaped and/or substantially semi-spherical and/or substantially semi-cylindrical.
11. The absorption sheet according to any one of the preceding items, wherein the absorption elements are resonant to the electromagnetic wave.
12. The absorption sheet according to any one of the preceding items, wherein the absorption elements have a length of approximately half of a wavelength of the electromagnetic wave.
13. The absorption sheet according to any one of the preceding items, wherein the absorption elements have a length of 0.5-5 mm.
14. The absorption sheet according to any one of the preceding items, wherein the array of absorption elements comprises a plurality of absorption elements, such as N×1 absorption elements wherein N>=2 or 1×M absorption elements wherein M>=2, preferably N×M absorption elements, wherein N>=2 and M>=2.
15. The absorption sheet according to any one of the preceding items, wherein the electromagnetic wave has a frequency in the range of 30-300 GHz.
16. The absorption sheet according to any one of the preceding items, wherein the conductive portion of the absorption elements is made of a metal, such as gold, silver or copper. item
17. The absorption sheet according to any one of the preceding items, wherein the absorption elements are thinner than 10 mm, preferably thinner than 5 mm, more preferably thinner than 2 mm, even more preferably thinner than 1 mm, most preferably thinner than 0.1 mm.
18. The absorption sheet according to any one of the preceding items, wherein the resistive portion is configured to have an electrical conductivity σ lower than the electrical conductivity of the conductive portion.
19. The absorption sheet according to any one of the preceding items, wherein the resistive portion is NiCr 80/20.
20. The absorption sheet according to any one of the preceding items, wherein each absorption element is configured to absorb energy from the electromagnetic wave in a sub-region of the absorption sheet.
21. The absorption sheet according to any one of the preceding items, wherein each absorption element has an elongate body, such as in the form of an elongate strip or rod.
22. The absorption sheet according to any one of the preceding items, wherein the absorption elements are substantially square wave shaped and/or saw tooth shaped.
23. The absorption sheet according to any one of the preceding items, wherein the absorption elements have a first element part and a second element part, wherein the first element part and the second element part are separated by the resistive portion.
24. The absorption sheet according to any one of the preceding items, wherein each absorption element comprises a first region and a second region, wherein the first and second regions are spaced apart from each other and capacitively coupled to each other.
25. The absorption sheet according to item 24, wherein only one of the first region and the second region comprises a resistive portion.
26. A system for performing a radiation characterization, such as a millimeter wave characterization, of a device under test, the system comprising:
    an absorption sheet for absorbing power from an electromagnetic wave generated by the device under test, comprising:
        a substrate having low thermal conductivity and low electrical conductivity;
        an array of absorption elements configured to absorb electromagnetic energy from the electromagnetic wave, the array of absorption elements embedded in or arranged on the substrate, each absorption element comprising: a conductive portion made of an electrically conductive material, such as a metal, wherein the conductive portion is adapted to receive the electromagnetic wave; and a resistive portion embedded in the conductive portion, the resistive portion adapted to absorb heat from a current generated by the electromagnetic wave in the conductive portion;
    a thermal imaging camera, such as an infra-red camera; and
    a processing unit configured to convert images from the thermal imaging camera providing a heat distribution to a corresponding radiation distribution of the electromagnetic wave.
27. The system according to item 26, wherein the thermal imaging camera is configured to provide images of the absorption sheet.
28. The system according to any one of items 26-27, the thermal imaging camera is configured to provide images of the absorption sheet at a specific point in time or during a limited interval.
29. The system according to any one of items 26-28, wherein the processing unit is further configured to control enabling and disabling of the radiation of the device under test.
30. The system according to any one of items 26-29, wherein the absorption sheet is the absorption sheet according to any one of items 1-25.
31. A method of measuring a radiative near field of a device under test, the method comprising the steps of:
    providing an absorption sheet comprising an array of isolated absorption elements configured to absorb electromagnetic energy from an electromagnetic wave from the device under test and generate heat locally in the absorption elements;
    arranging the absorption sheet in proximity to the device under test;
    enabling the device under test to generate the electromagnetic wave;
    obtaining thermal images of the absorption sheet; and
    converting the thermal images to a distribution of magnitudes of the electromagnetic wave of the absorption sheet.
32. The method according to item 31, wherein the device under test is enabled to generate the electromagnetic wave at a reference time, and wherein the thermal images are obtained at least at a second point in time at a predefined delay relative to the reference time.

33. The method according to item 32, wherein the predefined delay is selected such that thermal images are obtained approximately at a peak of heat in the absorption elements or over a period of time covering the peak of heat in the absorption elements.

34. The method according to any one of items 31-33, wherein the absorption sheet is arranged at a distance within 0.1-200 mm from the device under test, preferably within 0.1-100 mm from the device under test, more preferably within 0.1-20 mm from the device under test, even more preferably within 0.1-5 mm from the device under test.

35. The method according to any one of items 31-34, wherein each absorption element generates a local heat corresponding to a local magnitude of the electromagnetic wave.

36. The method according to any one of items 31-35, wherein the thermal images are provided by a thermal imaging camera.

37. The method according to any one of items 31-36, wherein the thermal images form a heat distribution of the absorption sheet.

38. The method according to any one of items 31-37, wherein a frequency of the electromagnetic wave is approximately a resonance frequency of the absorption elements.

39. The method according to any one of items 31-38, wherein each absorption element is a measurement point.

40. The method according to any one of items 39, further comprising the step of comparing measured magnitudes of the electromagnetic wave in the measurement points against a predefined radiation threshold.

41. The method according to any one of items 31-40, wherein the method is part of a compliance test of the device under test.

42. The method according to any one of items 31-41, wherein the device under test is a 5G device.

43. The method according to any one of items 31-42, wherein the electromagnetic wave is propagated by one or a plurality of antennas.

44. The method according to any one of items 31-43, comprising the step of obtaining thermal images of the absorption sheet at a specific point in time or during a limited interval upon enabling the device under test to generate the electromagnetic wave.

45. The method according to any one of items 31-44, wherein the absorption sheet is the absorption sheet according to any one of items 1-25.

46. A method of characterizing a radiative near field of a device under test, the method comprising the steps of:
providing an absorption sheet comprising an array of isolated absorption elements configured to absorb electromagnetic energy from an electromagnetic wave from the device under test and generate heat locally in the absorption elements;
arranging the absorption sheet in proximity to the device under test;
enabling the device under test to generate the electromagnetic wave;
obtaining thermal images of the absorption sheet; and
characterizing the radiative near field of the device under test in an area based on the thermal images.

The invention claimed is:

1. An absorption sheet for absorbing power from an electromagnetic wave generated by a device under test, the absorption sheet comprising:
a substrate having a thermal conductivity k lower than 1 W/m/K and a electrical conductivity $\sigma$ lower than $10^{-4}$ S/m;
an array of absorption elements configured to absorb electromagnetic energy from the electromagnetic wave, the array of absorption elements embedded in or arranged on the substrate, each absorption element comprising:
a conductive portion made of an electrically conductive material, wherein the conductive portion is adapted to receive the electromagnetic wave; and
a resistive portion embedded in the conductive portion, the resistive portion adapted to absorb heat from a current generated by the electromagnetic wave in the conductive portion,
wherein the conductive portion comprises a first element part and a second element part, wherein the first element part and the second element part are separated by the resistive portion, and
wherein each absorption element has an elongate and planar body.

2. The absorption sheet according to claim 1, wherein the absorption elements are spaced apart from each other.

3. The absorption sheet according to claim 1, wherein the thermal conductivity k is lower than 0.1 W/m/K.

4. The absorption sheet according to claim 1, wherein the electrical conductivity $\sigma$ is lower than $10^{-7}$ S/m.

5. The absorption sheet according to claim 1, wherein a frequency of the electromagnetic wave is approximately a resonance frequency of the absorption elements.

6. The absorption sheet according to claim 1, wherein the array of absorption elements comprises N×M absorption elements, wherein N>=2 and M>=2.

7. The absorption sheet according to claim 1, wherein each absorption element comprises a first region and a second region, wherein the first and second regions are spaced apart from each other and capacitively coupled to each other, wherein only one of the first region and the second region comprises a resistive portion.

8. The absorption sheet according to claim 1, wherein the absorption elements have a length of approximately half of a wavelength of the electromagnetic wave.

9. The absorption sheet according to claim 1, wherein the absorption elements have a length of 0.5-5 mm.

10. The absorption sheet according to claim 1, wherein the absorption elements are substantially square wave shaped and/or saw tooth shaped.

11. A system for performing a radiation characterization of a device under test, the system comprising:
an absorption sheet for absorbing energy from an electromagnetic wave generated by the device under test, comprising:
a substrate having a thermal conductivity k lower than 1 W/m/K and an electrical conductivity $\sigma$ lower than $10^{-4}$ S/m;
an array of absorption elements configured to absorb electromagnetic energy from the electromagnetic wave, the array of absorption elements embedded in or arranged on the substrate, each absorption element comprising: a conductive portion made of an electrically conductive material, wherein the conductive portion is adapted to receive the electromagnetic wave; and a resistive portion embedded in the conductive portion, the resistive portion adapted to absorb heat from a current generated by the electromagnetic wave in the conductive portion, or wherein each absorption element comprises one material which is both electrically conductive and adapted to absorb heat generated by the electromagnetic wave, wherein the conductive portion comprises a first element part and a second element part, wherein the first element part and the second element part are separated by the resistive portion, and wherein each absorption element has an elongate and planar body;

a thermal imaging camera; and a processing unit configured to convert images from the thermal imaging camera providing a heat distribution to a corresponding radiation distribution of the electromagnetic wave.

12. The system according to claim 11, wherein the thermal imaging camera is configured to provide images of the absorption sheet.

13. The system according to claim 11, wherein the thermal imaging camera is configured to provide images of the absorption sheet at a specific point in time or during a limited interval.

14. A method of measuring a radiative near field of a device under test, the method comprising the steps of:

providing an absorption sheet comprising an array of isolated absorption elements configured to absorb electromagnetic energy from an electromagnetic wave from the device under test and generate heat locally in the absorption elements, each absorption element comprising a conductive portion made of an electrically conductive material and adapted to receive the electromagnetic wave and a resistive portion embedded in the conductive portion, wherein the resistive portion is adapted to absorb heat from a current generated by the electromagnetic wave in the conductive portion, wherein the conductive portion comprises a first element part and a second element part, wherein the first element part and the second element part are separated by the resistive portion, and wherein each absorption element has an elongate and planar body;

arranging the absorption sheet in proximity to the device under test;

enabling the device under test to generate the electromagnetic wave;

obtaining thermal images of the absorption sheet; and converting the thermal images to a distribution of magnitudes of the electromagnetic wave of the absorption sheet.

15. The method according to claim 14, wherein the device under test is enabled to generate the electromagnetic wave at a reference time, and wherein the thermal images are obtained at least at a second point in time at a predefined delay relative to the reference time.

16. The method according to claim 15, wherein the predefined delay is selected such that thermal images are obtained approximately at a peak of heat in the absorption elements or over a period of time covering the peak of heat in the absorption elements.

17. The absorption sheet according to claim 1, wherein each absorption element is configured to generate a local electrical current, wherein the local electric current produces a loss through a region of resistance.

* * * * *